United States Patent [19]

Yoshikawa et al.

[11] 4,047,998
[45] Sept. 13, 1977

[54] METHOD OF POLARIZING A THERMOPLASTIC RESIN FILM

[75] Inventors: Shinsuke Yoshikawa; Syuuzi Terasaki; Tohru Sasaki, all of Iwaki, Japan

[73] Assignee: Kureha Kagaku Kogyo Kabushiki Kaisha, Tokyo, Japan

[21] Appl. No.: 667,311

[22] Filed: Mar. 16, 1976

[30] Foreign Application Priority Data

Mar. 17, 1975 Japan .................................. 50-31152

[51] Int. Cl.$^2$ ............................................ B29C 19/06
[52] U.S. Cl. ..................................... 156/275; 29/592; 156/184; 307/88 ET; 427/100
[58] Field of Search .......................... 156/272, 275, 184; 29/592, 594; 307/88 ET; 179/111 E; 427/100; 310/8, 8.3, 8.6–8.7, 9, 9.5, 9.7, 8.5

[56] References Cited

U.S. PATENT DOCUMENTS

| | | | |
|---|---|---|---|
| 3,696,505 | 10/1972 | Turnhout | 307/88 ET X |
| 3,706,131 | 12/1972 | Turnhout | 307/88 ET X |
| 3,894,243 | 7/1975 | Edelman et al. | 307/88 ET |

*Primary Examiner*—David A. Simmons
*Attorney, Agent, or Firm*—Sughrue, Rothwell, Mion, Zinn and Macpeak

[57] ABSTRACT

A method is disclosed for polarizing a thermoplastic resin film having a continuous metal electrode on one surface and a plurality of discrete electrodes on the other surface. An additional thermoplastic resin film coated on one surface with an evaporated metal coating is placed on the first thermoplastic resin film such that the evaporated metal coating comes into contact with the discrete electrodes. A polarizing d.c. voltage is applied between the continuous metal electrode and the evaporated metal coating.

5 Claims, 1 Drawing Figure

METHOD OF POLARIZING A THERMOPLASTIC RESIN FILM

BACKGROUND OF THE INVENTION

This invention relates to a method of effectively polarizing a thermoplastic resin film provided on both surfaces with metallic films as electrodes, and, particularly, to the method where at least one of the metallic films is divided to form a plurality of discrete electrode segments.

It is generally known that one can form a material having a high piezoelectricity and pyroelectricity by polarizing a thermoplastic resin having a high polarity, such as polyvinylidene fluoride, polyvinyl fluoride, polyvinyl chloride and nylon 11, etc. It is also known to use piezoelectricity, for example, for electric acoustic convertors, vibration measuring instruments, piezoelectric switches and pulsemeters or, the like, and to use the pyroelectricity, for example, for infrared ray sensors, temperature change measuring instruments, fire alarms and pyroelectric switches, etc.

Where such elements are used in electrical devices, a film shaped piezoelectric or pyroelectric element (referred to only as a piezoelectric element hereinafter) is used, and it is absolutely necessary to have electrodes adhering to both surfaces of the film. In the case where a considerably high electric field is applied across the two electrodes, e.g. when the thickness of the film is 6 to 50 microns and the voltage is more than 30 volts, creeping discharge is likely to occur on the side marginal portions, and the two electrodes tend to short-circuit on the terminal faces thereof so as to render the elements unusable. In order to avoid occurrence of such creeping discharge across the two electrodes, it is necessary to provide a marginal portion where no electrode is disposed on one or both side surfaces of the film, thereby electrically separating the electrodes on both surfaces.

It is extremely inefficient to separately manufacture a plurality of piezoelectric elements of various sizes. As a result it is preferable to polarize a film having a large surface area with metallic thin film electrodes adhered to both surfaces thereof and subsequently to cut off individual elements from the polarized film. In this case, each of the elements cut off from the large surface area film is covered by a metallic film even in the vicinity of the side marginal portions thereof. Where it is desirable to remove the marginal portions, for reasons mentioned above, this can be accomplished by dissolving them with means of a chemical agent. However such an operation is very complicated and troublesome. In order to eliminate this disadvantage, it is possible to provide electrode-free marginal portions on a film of a large surface area in advance, permit a plurality of electrodes to adhere on the remaining surface of the film, polarize each electroded section, and then cut off individual elements.

Furthermore, it has been proposed to manufacture film shaped keyboard switches and co-ordinate input systems employing the piezoelectric or pyroelectric elements. In such cases, in order for the changes in piezoelectricity or pyroelectricity produced on each co-ordinate of the key to constitute a separate input, the electrode on one or both surfaces of the film must comprise a plurality of spot-like or linear individually independent electrodes.

As mentioned hereinabove, where a film is polarized which has a plurality of independent electrodes adhered on one surface or both surfaces thereof, it is necessary to apply voltage to the individually independent electrodes. It is quite complicated, however, to make an electrical connection to each of the individually independent electrodes. Thus, in order to apply voltage to each electrode in the most simple manner, it is preferable to provide electrodes of a large enough area to "face-contact" with some or all of the plurality of independent electrodes and to apply a voltage via the large area electrode into the small local electrodes. However, when electrodes of such a large surface area are used as a power source, the following problem occurs.

Stated in brief, in case of manufacturing piezoelectric elements etc., it is known that if other conditions are the same, in general the more the applied voltage increases, the higher piezoelectricity and pyroelectricity become. Further, it is also known that, within the range where the nature of the film (particularly, crystal form and the degree of crystallization) does not change so much, generally speaking, the more polarization temperature increases, the higher the piezoelectricity and pyroelectricity become. However, in general, the insulation resistance of the film will drop with a temperature rise, and the strength of the electric field to be formed thereby will decrease so that it is absolutely necessary to select an optimum condition in the light of the relationship between the applied voltage and the polarization temperature.

Anyhow, where it is desired to obtain a film having a high piezoelectricity or pyroelectricity, it is necessary to polarize the film by applying thereto a high voltage which is near the breakdown voltage for the polarization temperature involved. However, it is difficult to bring electrodes comprised of, for example, copper or iron plates, into tight contact with a thin film, and so there is a tendency for several air gaps to be formed in places thereon. Since the breakdown voltage of air is lower than that of the film to be polarized, during polarization corona discharge tends to occur in the air gap portions. Therefore, the possibility of pin holes being formed on the thin film exists. Further, when a voltage is applied across the thin film electrodes adhered on both surfaces of a thermoplastic resin film, even if the applied voltage exceeds the breakdown voltage of the film thereby causing a short-circuit, if the electrodes are thin, the electrodes formed in the vicinity of the short-circuited portion will evaporate to recover the insulation resistance between the two electrodes, resulting in a self-recovery action so that the film can be continuously polarized without causing serious damage. However, in the case where the metal film is too thick to be removed by evaporation, such self-recovery action can not be expected, and so it becomes impossible to effect continuously polarization of the film after the short-circuit takes place.

SUMMARY OF THE INVENTION

An object of the present invention is to provide a method of effectively polarizing a thermoplastic film provided on both surfaces with metallic film electrodes for applying a polarizing electric voltage, at least one of said electrodes being divided to form a plurality of discrete electrode segments.

Another object of the present invention is to eliminate the possibility of creeping discharge and/or short-circuit across the film during the polarization.

Acording to one aspect of the present invention, an additional thermoplastic resin film, on one surface of which a metallic film is evaporated, is used to polarize the first thermoplastic resin film. The additional film is put on one surface of the first film with the metallic film placed face down such that the latter intimately contacts with all of the discrete electrode segments on the first film. A d.c. voltage is applied between the metallic film of the additional film and the electrode on the back surface of the first film. When the latter electrode is also divided into a plurality of discrete segments, one or more additional films may be used in the same manner.

According to another aspect of the present invention, metal-free marginal portions are provided at least on the peripheries of the first film and the additional film. With this arrangement, the creeping discharge across the first film, which would occur when the metallic films are provided on the whole surfaces of the respective films, can be avoided. Another effect of the marginal portions is to minimize the possibility of film damage or accident. That is, since the first film forms a capacitor during the polarization, the larger the area of the electrodes, the larger the capacitance will be. When the capacitance is too large and if there is a local portion of the film in which the thickness of the film is relatively small or any conductive impurities are included, or if there is a local portion of the film in which the insulation breakdown occurs, due to corona discharge, the electric charge stored between the electrodes is apt to be discharged abruptly through the local portion, resulting in an enlargement of the broken down portion and a dangerous condition. Further, in case of continuously polarizing a long film according to the method of the present invention, both a film to be polarized and an additional film for polarization are laminated and wound in a roll. In polarizing, the lamination is drawn out from the roll. In some cases the lamination is taken up again on a take-up roll after the polarization. If the positive side of a power source is connected with the metal on the film for polarization and the metal is continuous, a high voltage or electric field is applied even to the original roll, so that there exists a considerable operational risk. In this case, therefore, it is necessary to segment the metallic thin film of the film for polarization by electrically insulating belts. Further, in case of polarizing a wide film, it is sometimes necessary to provide insulating belts even in the direction of the width thereof. Therefore, the phrase "substantially the entire surface" is intended to cover a metallic film which does not cover the marginal edge portions and the portions on which insulating belts are provided. Further, where marginal portions are provided on the back surface of the film to be polarized, the provision of a metal-free marginal portion in the additional thermoplastic resin film is not necessary. When the metallic film on the film is to be grounded, the metal film of the first thermoplastic resin film is segmented and the positive voltage is applied to the segments sequentially. However, it is unnecessary to take such procedure when an electric current is fed in batch through the film wound round the roll.

The method of polarization according to the present invention will now be described in further detail hereinbelow.

BRIEF DESCRIPTION OF THE DRAWINGS

The FIGURE is a perspective view of laminate layers helpful in understanding the method of the present invention.

DETAILED DESCRIPTION OF THE INVENTION

Figure 1:
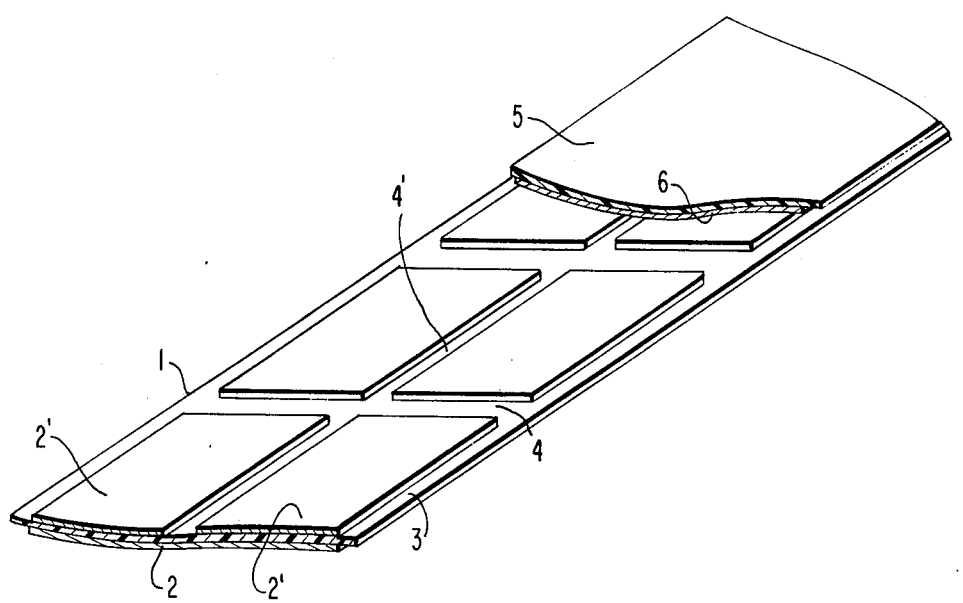

The accompanying drawing illustrates a thermoplastic resin film to be polarized such as polyvinylidene fluoride film 1, 150 mm wide and 9$\mu$ thick, having metal such as aluminum evaporated on both surfaces thereof by the vacuum evaporation process. Aluminum 2 is evaporated onto the entire back surface of the film except for the marginal portion 3, 10 mm wide, extending along both edges thereof. A plurality of aluminum rectangular evaporated elements 2', 60 mm wide and 90 mm long, are formed in two rows on the front side of the film at insulation space 4 of 10 mm, and at a longitudinal insulation space intervals 4' between the evaporated elements 2' of 10 mm. According to the result of observation by means of an electronic microscope, the thickness of each evaporated film was 500 to 550 A.

On the back surface of the film 1 (top surface as illustrated) on which the segmented aluminum coating is deposited, an additional thermoplastic resin film such as a polyester film 5, having a surface 6, on which an aluminum coating of 500 to 550 A thick is deposited, was placed with the surface 6 face down. The resulting lamination of 10 m length was wound around an insulating core having a diameter of 150 mm resulting in a total of 100 sheets of the above-mentioned rectangular piezoelectric elements. Tin foils, 7 $\mu$ thick, 40 mm long and 30 mm wide, for use as electrode terminals, were brought into contact with the metal layer evaporated onto surface 6 of the additional 5 film and with the metal layer 2 evaporated on the bottom side of the first film 1, respectively. A d.c. voltage of 800 volts was applied to the electrodes for 15 minutes while they were dry-heated at 120° C. The laminate roll was then cooled down to room temperature while the voltage was still being applied, thereby achieving polarization. Breakdown of insulation occurred frequently while the voltage was being applied. However, 75 out of the 100 sheets of rectangular piezoelectric film elements were of marketable quality, having a piezoelectric constant $d_{31}$ the value of which is 8.2 $\times$ 10$^{-7}$ c.g.s.e.s.u. without causing any short-circuit thanks to self-recovery action thereof.

About 25 sheets of poor quality were obtained having holes of 3 to 10 mm in diameter formed therein due to the self-recovery action, and at the same time self-recovery action of the polyester evaporated film was observed.

The electrodes evaporated on the film 1 to be polarized and the metallic thin film on the film 5 for polarization are formed, respectively, according to a thin film coating process such as evaporation, plating, etc. Any metallic material suitable for evaporation and plating electrodes, such as gold, silver, copper, nickel, iron, chrome, aluminum, tin and tungsten etc., can be used. Any additional thermoplastic resin film, which is generally available in a film shape and is capable of resisting the polarization temperature ca be used, as the additional film 5 such as, for example, polyethylene, polypropylene, polyvinylidene chloride, copolymer of vinylidene chloride and polyvinyl chloride, nylon, polyester, polycarbonate, polyvinyl fluoride, polyvinyl chloride etc. Further, a film with a thickness up to about 500 μ can be used for the purpose if it is flexible. However, if the film 5 is too thick, it tends to be easily separated from the film to be polarized, and therefore a suitable thickness of the film 5 for polarization is usually 3 to 200 μ.

According to the present invention, both the film to be polarized and the film for polarization are so thin and flexible that the films can intimately contact with each other over the whole area thereof, and therefore there is almost no fear of occurrence of breakdown of the film due to discharge through air gaps therebetween in the course of polarization, and also even if breakdown occurs in the film to be polarized during the process of polarization, the thin film electrodes on the film for polarization are easily evaporated to provide self-recovery action so that it is possible to effect polarization in a high yield keeping the damage thereof to a minimum.

According to the method of the present invention, it is possible to produce efficiently a metallized piezoelectric film element on both surfaces of which evaporated elements are formed in a desired configuration so that insulation space intervals can be provided in the periphery of the evaporated elements. The method of the present invention can be easily applied to the manufacture of acoustic convertor elements, electrical and mechanical convertor elements, etc., so that its industrial utility value is very high.

What is claimed is:

1. A method of polarizing a first thermoplastic resin film having metallic electrodes evaporated on both surfaces thereof, said film being of the type capable of being polarized into a piezoelectric film by application of an electric field of a predetermined amount thereacross, one of said electrodes consisting of a plurality of individual electrode elements separated and insulated from one another, the improvement comprising the steps of placing onto said one electrode a laminate of an additional thermoplastic resin film having an evaporated continuous metal coating on one surface thereof, said laminate being placed so that said metal coating contacts said plurality of individual electrode elements, and applying said electric field between said metal coating and the other metallic electrode of said first thermoplastic resin film.

2. The method of claim 1, wherein a marginal strip along each edge of each surface of said first thermoplastic layer is left uncovered by any metallic electrode.

3. The method of claim 2, wherein the surface of said additional film coated with said metal coating has marginal strips along each edge thereof which are not so coated.

4. The method of claim 1 further comprising the steps of, winding the combined first and associated metallic electrodes and coatings on a spool prior to the step of applying said electric field, and wherein the step of applying is carried out while said combined layers are on said spool.

5. The method of claim 1, wherein the step of applying comprises, applying a d.c. voltage of about 800 volts for about 15 minutes at a temperature of about 120°, and subsequently cooling down the combined layers to room temperature while continuing the application of the 800 volts until room temperature is achieved.

* * * * *